United States Patent
Sheu et al.

(10) Patent No.: US 8,329,585 B2
(45) Date of Patent: Dec. 11, 2012

(54) METHOD FOR REDUCING LINE WIDTH ROUGHNESS WITH PLASMA PRE-ETCH TREATMENT ON PHOTORESIST

(75) Inventors: Ben-Li Sheu, Sunnyvale, CA (US); Martin Shim, Pleasanton, CA (US); Jonathan Kim, Danville, CA (US)

(73) Assignee: Lam Research Corporation, Fremont, CA (US)

( * ) Notice: Subject to any disclaimer, the term of this patent is extended or adjusted under 35 U.S.C. 154(b) by 500 days.

(21) Appl. No.: 12/620,335

(22) Filed: Nov. 17, 2009

(65) Prior Publication Data

US 2011/0117749 A1    May 19, 2011

(51) Int. Cl.
*H01L 21/302* (2006.01)

(52) U.S. Cl. ............ 438/689; 216/41; 216/67; 438/694; 438/696; 438/706; 438/712; 438/735

(58) Field of Classification Search .................. None
See application file for complete search history.

(56) References Cited

U.S. PATENT DOCUMENTS

| | | | |
|---|---|---|---|
| 2008/0096374 A1* | 4/2008 | Shamiryan et al. | 438/591 |
| 2009/0162553 A1 | 6/2009 | Romano et al. | |
| 2009/0163035 A1* | 6/2009 | Romano et al. | 438/736 |
| 2009/0197422 A1 | 8/2009 | Kang et al. | |
| 2010/0108264 A1* | 5/2010 | Delgadino et al. | 156/345.35 |

OTHER PUBLICATIONS

U.S. Appl. No. 12/595,234, filed Oct. 8, 2009.
U.S. Appl. No. 12/263,662, filed Nov. 3, 2008.
U.S. Appl. No. 12/233,517, filed Sep. 18, 2008.

* cited by examiner

*Primary Examiner* — Lan Vinh
*Assistant Examiner* — Jiong-Ping Lu
(74) *Attorney, Agent, or Firm* — Beyer Law Group LLP

(57) ABSTRACT

A method for reducing line width roughness (LWR) of a feature in an etch layer below a patterned photoresist mask having mask features is provided. The method includes (a) non-etching plasma pre-etch treatment of the photoresist mask, and (b) etching of a feature in the etch layer through the pre-treated photoresist mask using an etching gas. The non-etching plasma pre-etch treatment includes (a1) providing a treatment gas containing $H_2$ and COS, (a2) forming a plasma from the treatment gas, and (a3) stopping the treatment gas.

20 Claims, 6 Drawing Sheets

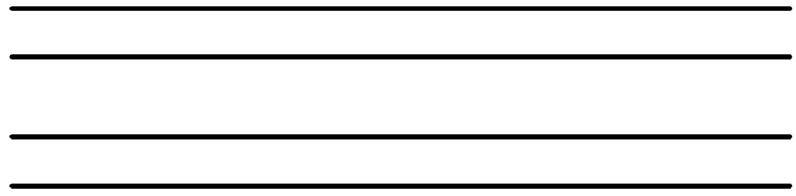
Low or No Line Width
Roughness     FIG. 1A
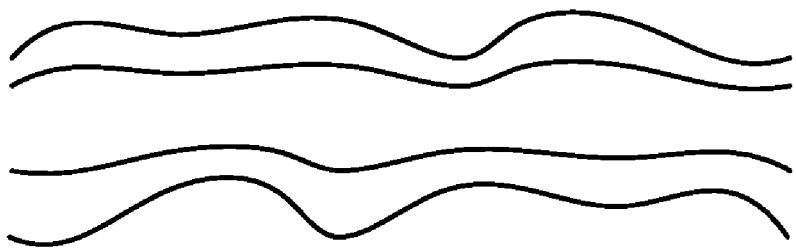
High Line Width
Roughness
(Low-Frequency)     FIG. 1B
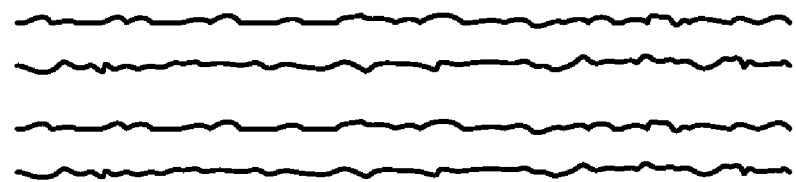
High Line Width
Roughness
(High-Frequency)     FIG. 1C

METHOD FOR REDUCING LINE WIDTH ROUGHNESS WITH PLASMA PRE-ETCH TREATMENT ON PHOTORESIST

BACKGROUND OF THE INVENTION

The present invention relates to reducing line width roughness (LWR) of a feature of an etch layer. More specifically, the present invention relates to a plasma pre-etch treatment of a patterned photoresist mask through which a feature is to be etched in an underlying etch layer.

During semiconductor wafer processing, features of the semiconductor device are defined in the wafer using well-known patterning and etching processes. In these processes (photolithography), a photoresist (PR) material may be deposited on the wafer and then is exposed to light filtered by a reticle. The reticle may be a transparent plate that is patterned with exemplary feature geometries that block light from propagating through the reticle.

After passing through the reticle, the light contacts the surface of the photoresist material. The light changes the chemical composition of the photoresist material such that a developer can remove a portion of the photoresist material, resulting in a patterned photoresist mask. In the case of positive photoresist materials, the exposed regions are removed, and in the case of negative photoresist materials, the unexposed regions are removed. Thereafter, the wafer is etched to remove the underlying material from the areas that are no longer protected by the patterned photoresist mask, and thereby produce the desired features in the wafer.

As the critical dimensions (CDs) of semiconductor integrated circuitry features shrinks below 45 nm, the control of photoresist mask layers for line and space features with conventional photolithography process is reaching its limits. Poor and distorted line edges, as well as incompletely developed residue of photoresist layer will cause significant roughness at the edges of line and space features causing line edge roughness (LER) and variation in the CD of the line and space features, i.e., line width roughness (LWR). This non-uniform edge pattern will be transferred and/or amplified during multiple etch process steps that are required for semiconductor device fabrication, causing degradation of device performance and yield loss.

The ideal feature has an edge that is "straight like a ruler" as shown in FIG. 1A, when viewed from top down. However, for various reasons as described above, the actual line feature may appear jagged and have line width roughness (LWR). The LWR includes a low-frequency roughness, such as a wiggling (as shown in FIG. 1B), and a high-frequency roughness such as an irregular edge surface (as shown in FIG. 1C). In reality, the LWR is a combination of the high-frequency LWR and the low-frequency LWR. The LWR is a measure of how smooth the edge of a linear feature is when viewed from the top down. Features with high LWR are generally very undesirable because the CD measured along the line feature would vary from position to position, rendering operation of the resulting device unreliable.

SUMMARY OF THE INVENTION

To achieve the foregoing and in accordance with the purpose of the present invention, a method for reducing line width roughness (LWR) of a feature in an etch layer below a patterned photoresist mask having mask features is provided. The method includes (a) non-etching plasma pre-etch treatment of the photoresist mask, and (b) etching of a feature in the etch layer through the pre-treated photoresist mask using an etching gas. The non-etching plasma pre-etch treatment includes (a1) providing a treatment gas containing $H_2$ and COS, (a2) forming a plasma from the treatment gas, and (a3) stopping the treatment gas.

The non-etching plasma pre-etch treatment may further include curing and smoothing surfaces of the mask features using the plasma formed from the treatment gas. The curing and smoothing may include reducing single and double C—O bonds from the surfaces of the photoresist mask using $H_2$ component, and depositing materials on sidewalls of the mask features using COS component. The thickness of the deposited materials may be less than 5 nm. The non-etching pre-treating substantially preserves an original aspect ratio of the mask features.

In accordance with an embodiment of the present invention, $H_2$ and COS has at least 50% of a total flow of the treatment gas. Preferably, the $H_2$ and COS has at least 60% of the total flow of the treatment gas. More preferably, the $H_2$ and COS has at least 90% of the total flow of the treatment gas. The treatment gas may further contain $N_2$ and $C_4F_8$. In an embodiment of the present invention, the treatment gas essentially consists of $H_2$ and COS. The flow ratio of $H_2$ and COS may be between 10:1 to 60:1, preferably between 20:1 to 50:1, more preferably about 30:1.

The non-etching pre-etch treatment may include controlling a bias voltage such that the non-etching plasma pre-etch treatment does not open or substantially etch an underlying layer exposed through the mask features. The applied bias voltage may be between 0 to 500V, preferably between 0 to 150 V.

In another manifestation of the invention, an apparatus for reducing line width roughness (LWR) of a feature in an etch layer below a patterned photoresist mask having mask features is provided. The apparatus comprises a plasma processing chamber that includes a chamber wall forming a plasma processing chamber enclosure, a substrate support for supporting a substrate within the plasma processing chamber enclosure, a pressure regulator for regulating the pressure in the plasma processing chamber enclosure, at least one electrode for providing power to the plasma processing chamber enclosure for sustaining a plasma, a gas inlet for providing gas into the plasma processing chamber enclosure; and a gas outlet for exhausting gas from the plasma processing chamber enclosure. The plasma processing chamber further comprises a gas source in fluid connection with the gas inlet. The gas source includes a photoresist mask non-etching plasma pre-etch treatment gas source, and a feature etching gas source. A controller is controllably connected to the gas source and the at least one electrode. The controller comprises at least one processor and computer readable media. The computer readable media includes (a) computer readable code for non-etching plasma pre-etch treatment of the photoresist mask, including (a1) computer readable code for providing a treatment gas containing $H_2$ and COS, (a2) computer readable code for forming a plasma from the treatment gas, and (a3) computer readable code for stopping the treatment gas, and (b) computer readable code for etching a feature in the etch layer through the pre-treated photoresist mask using an etching gas.

In accordance with an embodiment of the present invention, the computer readable code for non-etching plasma pre-etch treatment further includes computer readable code for controlling a bias voltage such that the non-etching plasma pre-etch treatment does not open or substantially etch an underlying layer exposed through the mask features.

The computer readable code for non-etching plasma pre-etch treatment may further include computer readable code for controlling a flow ratio of $H_2$ and COS to be about 30:1.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which:

FIGS. 1A-C are schematic diagrams for explaining line width roughness.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 2:
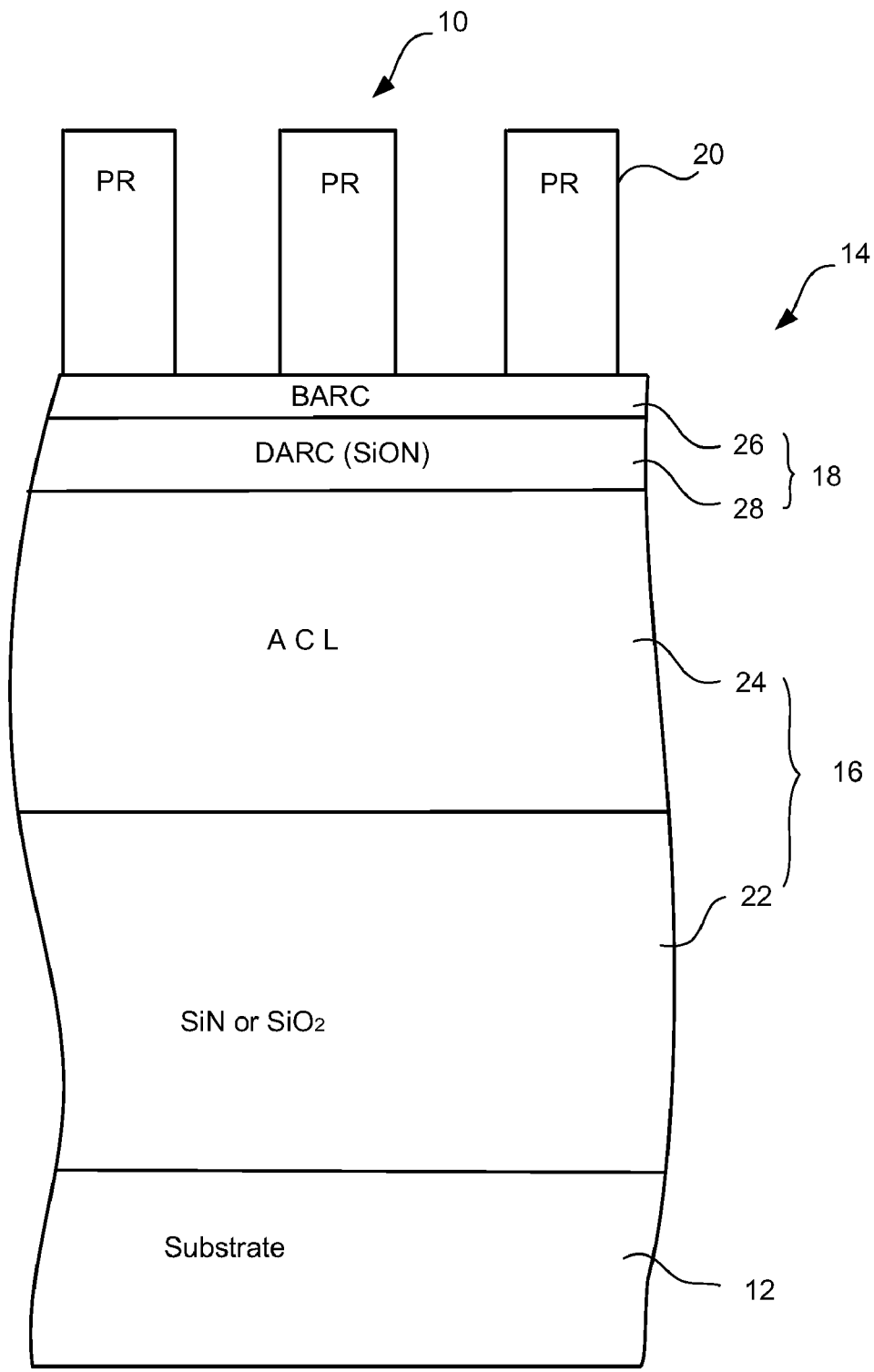
FIG. 2 is a diagram illustrating a schematic cross-sectional view of a stack of layers formed on a substrate, including a patterned photoresist mask having mask features, processed in accordance with one embodiment of the present invention.

To facilitate understanding, FIG. 2 is a schematic cross-sectional view of an example of a wafer stack 10 for front end of line (FEOL) applications such as dielectric material etch in which embodiments of the present invention may be applied. The wafer stack 10 includes a substrate 12 and a stack of layers 14 formed on the substrate 12. As shown in FIG. 2, the stack of layers 14 includes an etch layer 16 disposed below an antireflective coating (ARC) layer 18 below a patterned photoresist (PR) mask 20 having mask features. In this example, the photoresist mask 20 is of a 193 nm or higher generation photoresist material, and has a line-space pattern to form a plurality of lines and spaces in the etch layer. For example, the mask features form a line-space pattern that includes a plurality of lines where the mask material is formed, and grooves between the lines where the mask material has been removed by photolithography processes. The underlying layer, for example, the ARC layer 18 is exposed through the mask pattern at the bottom of the grooves. The PR mask 20 may have a CD about 45 nm or less. The present invention is applicable for the FEOL processes, such as a plasma pre-etch treatment of a photoresist mask for memory mask open, as well as for dielectric material etch. For example, the present invention is applied to a photoresist mask for the 30 nm generation DRAM fabrication process.

As shown in FIG. 2, the etch layer 16 may include a dielectric layer 22 and an amorphous carbon layer (ACL) 24 formed over the dielectric layer 22. The ACL layer 24 may function as a hardmask. The dielectric layer 22 may be made of a silicon oxide based dielectric material such as $SiO_2$, silicon nitride (SiN), or tetora-ethyl-ortho-silicate (TEOS). Amorphous carbon is similar to a polymer, but with less hydrogen and more carbon since it is deposited at high temperature greater than 200° C. by CVD, and thus it is more etch resistant than polymer. The ARC layer 18 may include a bottom antireflective coating (BARC) layer 26 formed below the PR mask 20, and a dielectric antireflective coating (DARC) layer 28 below the BARC layer 26. These layers minimize or eliminate reflections during exposure of the photoresist. The BARC/DARC layers may be organic-based or inorganic-based, and are usually composed of different materials from the underlying dielectric material. For example, the BARC layer 26 may be made of a carbon-based material, and the DARC layer 28 may be made of an inorganic material such as silicon oxynitride (SiON). However, the present invention is not limited to a specific stack of layers on the substrate, but is applicable to any patterned photoresist mask used as an etch mask for etching the underlying layers.

Figure 3:
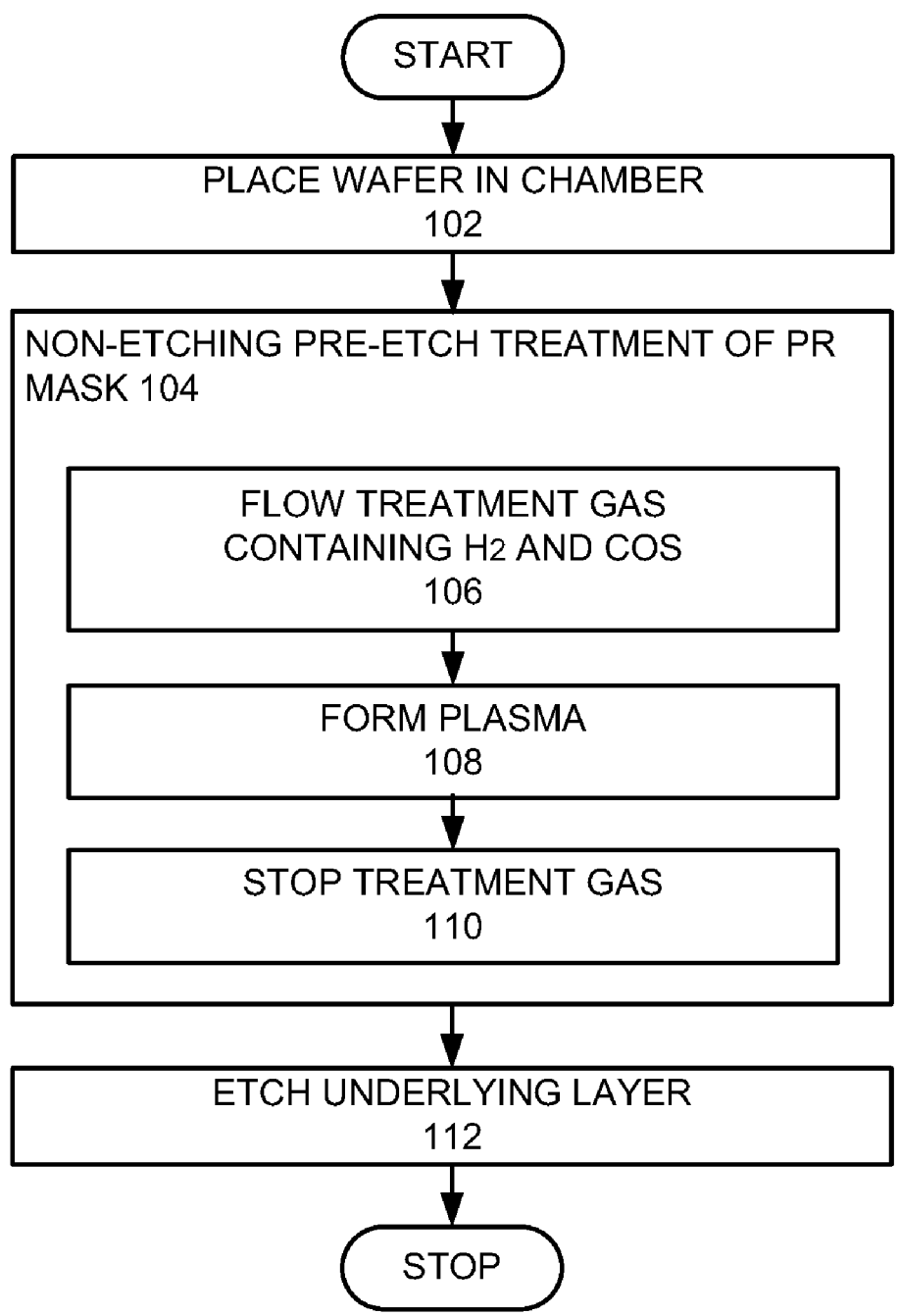
FIG. 3 is a flow chart of a non-etching plasma pre-etch treatment process in accordance with an embodiment of the invention.

FIG. 3 is a process flow chart for a method that may be used in an embodiment of the present invention. The method reduces line width roughness of line and space features in the plasma etch process, for example, for sub-45 nm node of dielectric etch applications. A wafer stack with a patterned photoresist mask features is placed into a plasma chamber (step 102), for example, a capacitively coupled plasma reactor which is used to etch dielectric materials. The plasma reactor may also be provided with conductor tools for the subsequent conductor etch processes. The patterned photoresist mask having mask features is treated (conditioned) by a non-etching plasma pre-etch treatment process (step 104). The non-etching plasma pre-etch treatment includes providing a treatment gas containing $H_2$ and COS (step 106), forming a plasma from the treatment gas (step 108), with which the photoresist mask is treated, and stopping the treatment gas (step 110) to stop the non-etching pre-etch treatment. After the non-etching plasma pre-etch treatment of the photoresist mask, the underlying etch layer is etched through the pre-treated photoresist mask using etching gases (step 112). It should be noted that the treatment gas containing $H_2$ and COS can also be used in inductively coupled plasma reactors as long as similar bias and RF powers are input.

For example, when the non-etching plasma pre-etch PR treatment is applied to the wafer stack 14 as shown in FIG. 2, the subsequent etch step 112 may include a BARC/DARC layer open process, a hardmask (ACL) open process, and a dielectric etch process. It should be noted that in the non-etching plasma pre-etch treatment (step 104) does not open or substantially etch the underlying ARC layer or other layer (second mask layer or dielectric layer) exposed through the photoresist mask features. In other words, the etch rate of the underlying layer is not detectable or very slow and thus negligible.

In accordance with embodiments of the present invention, in the non-etching plasma pre-etch treatment, the surfaces of the photoresist mask features are cured and smoothed using the plasma formed from the treatment gas. More specifically, the non-etching plasma pre-etch treatment smoothens the edge of line-and-space features, and strengthens the robustness of the photoresist from shape deformation such as collapsing, twisting, wiggling, and the like. Rough photoresist surfaces and edges developed during the photolithography process are removed, such that undesirable excess rough features at the line edges will not transfer to the final etched features of the etch layer.

The use of hydrogen gas ($H_2$) is believed to cure the photoresist mask layer to provide a smoothened surface, as well as to generate a surface with more uniform etch resistant. The curing process by the $H_2$ component in the plasma reduces single and double C—O bonds from the surfaces of the photoresist mask (as a chemical reaction), such that the cured photoresist mask will sustain a more uniform edge deformation (i.e., less irregularities in the line edges) during the subsequent etch processes, yielding a better LWR. As a physical reaction, the photoresist mask shrinks as a result of the cure process.

In accordance with the embodiments of the present invention, the treatment gas further includes carbonyl sulfide (commonly written as "COS", with the formula OCS) as an additive. The novel treatment gas of the $H_2$ and COS combination not only enhances improvement in the LWR (especially high-frequency roughness) compared with the conventional $H_2$ only treatment gas (i.e., without COS), but also prevents the photoresist line patterns from collapsing (low-frequency roughness or wiggling of the line features). It is believed that the COS component in the non-etching plasma pre-etch treatment facilitates depositing of materials on sidewalls of the mask features using COS component. As a chemical reaction, it is believed that the plasma from the COS component creates bonds between sulfur and carbon on the surface of the sidewalls. That is, the application of carbonyl sulfide in the pre-etch plasma treatment facilitates passivation and strengthening of the sidewalls of the photoresist features and reduce the line pattern wiggling. In accordance with an embodiment of the present invention, the thickness of the deposited materials is a few nanometers, or less than 5 nm.

Figure 4A:
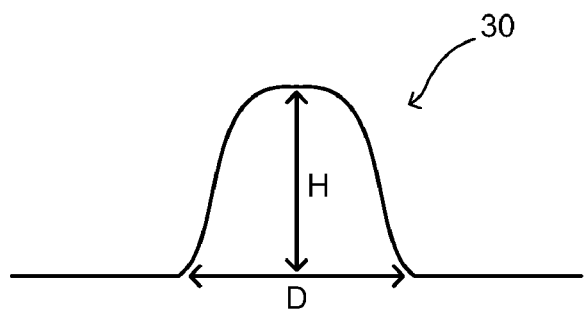
FIGS. 4A and 4B schematically illustrate cross-sectional views of a photoresist feature before and after a conventional $H_2$-only plasma pre-etch treatment, respectively.
Figure 4B:
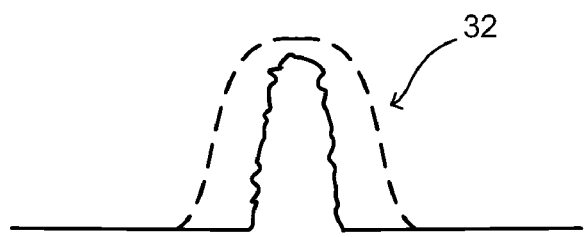

FIG. 4A schematically illustrates a cross-sectional view of a line-pattern photoresist feature 30 and its aspect ratio (H/D). Applicants has found that the curing process using a conventional $H_2$-only treatment gas is difficult to control its aggressive attack to the sidewalls of the photoresist mask, and that the process tends to thin down the photoresist mask feature 32 to have a higher aspect ratio, as shown in FIG. 4B. Thinned line-pattern features 32 and/or its higher aspect ratio due to curing may cause a section of the line pattern to collapse, creating wiggling or low-frequency LWR when viewed from the top.

Figure 4C:
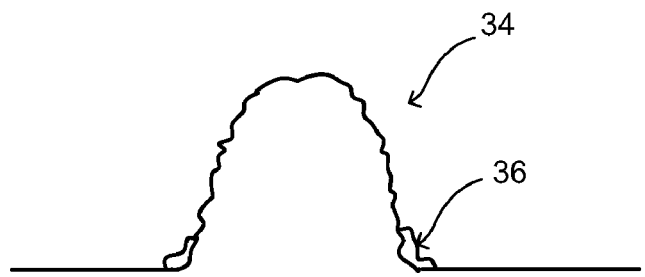
FIGS. 4C and 4D schematically illustrate cross-sectional views of a photoresist feature before and after the non-etching plasma pre-etch treatment, respectively, in accordance with an embodiment of the present invention.
Figure 4D:
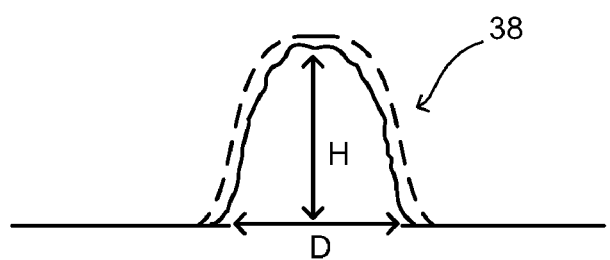

FIG. 4C is a schematic yet more realistic cross-sectional view of a photoresist feature 34. Typically, there is scum 36 such as residue or undeveloped photoresist material at the bottom portion of the mask features. Such undesirable residues also affect the LWR. In accordance with the embodiments of the claimed invention, the novel combination of $H_2$ and COS as the treatment gas in the pre-etch plasma treatment modifies (smoothes and strengthens) the surfaces of the sidewalls of the photoresist features, and also maintains the aspect ratio of the mask features. That is, the non-etching plasma pre-treating substantially preserves the original aspect ratio by passivating the sidewall of the photoresist mask features by reaction with the COS component. Furthermore, it is believed that oxygen radicals of the COS component also helps clean the scum from the bottom portion of the mask features. FIG. 4D schematically illustrates a photoresist feature 38 after the non-etching plasma pre-etch treatment in accordance with an embodiment of the present invention.

Figure 5:
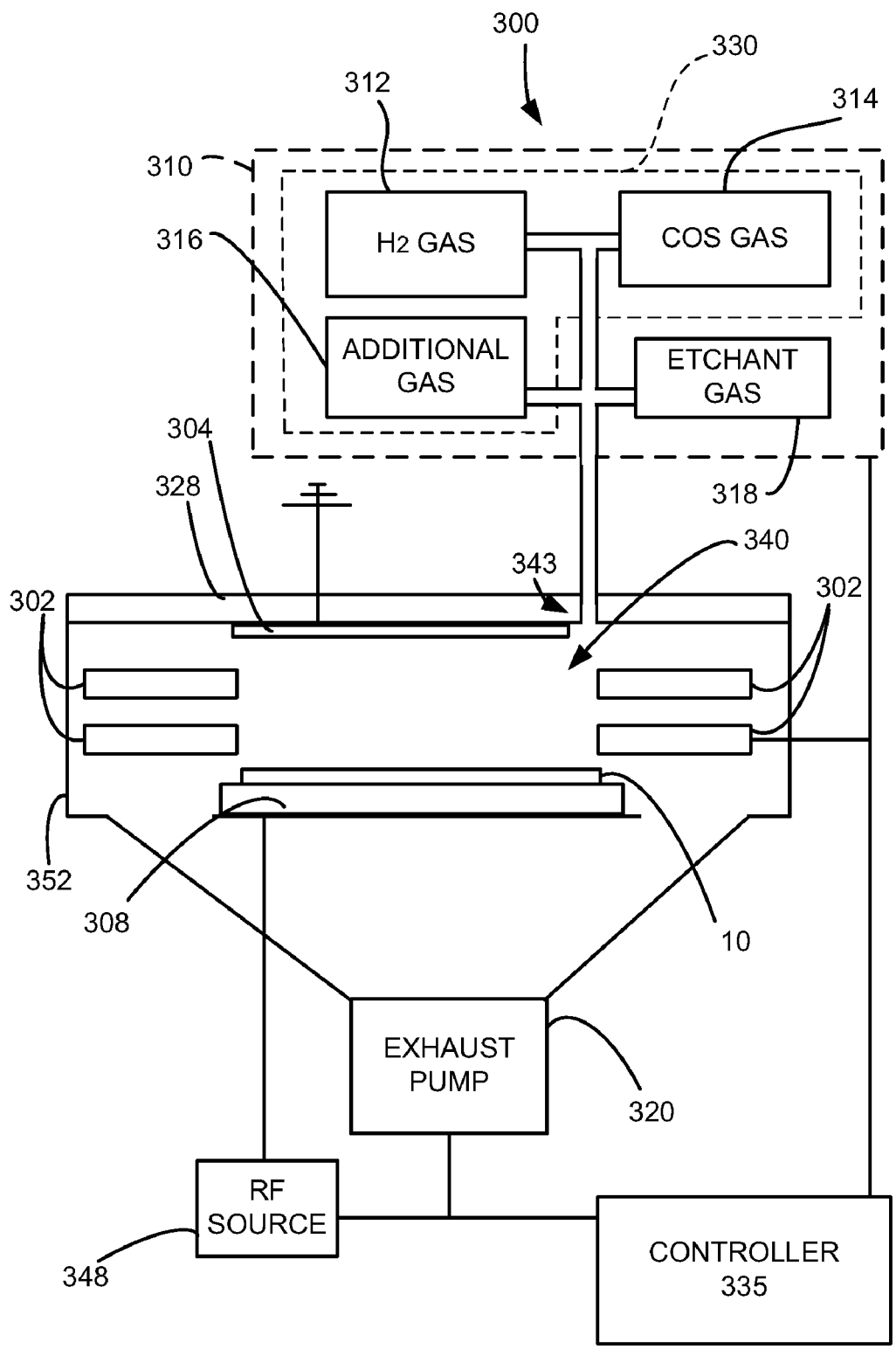
FIG. 5 is a diagram illustrating a schematic view of a plasma processing chamber that may be used for the non-etching plasma pre-etch treatment in accordance with one embodiment of the present invention.

The embodiments of the claimed invention may be performed using a capacitively coupled plasma reactor which is also used for the subsequent dielectric material etching (i.e., in-situ process). FIG. 5 shows a schematic view of a plasma processing chamber 300 that may be used for inventive non-etching plasma pre-etch treatment. The plasma processing chamber 300 comprises confinement rings 302, an upper electrode 304, a lower electrode 308, a gas source 310, and an exhaust pump 320 connected to a gas outlet. Within plasma processing chamber 300, a substrate 10 (a wafer with the stack of layers) is positioned upon the lower electrode 308. The lower electrode 308 incorporates a suitable substrate chucking mechanism (e.g., electrostatic, mechanical clamping, or the like) for holding the substrate 10. The reactor top 328 incorporates the upper electrode 304 disposed immediately opposite the lower electrode 308. The upper electrode 304, lower electrode 308, and confinement rings 302 define the confined plasma volume 340. Gas is supplied to the confined plasma volume 340 by the gas source 310 via a gas inlet 343, and is exhausted from the confined plasma volume 340 through the confinement rings 302 and an exhaust port by the exhaust pump 320. Besides helping to exhaust the gas, the exhaust pump 320 helps to regulate pressure. In this embodiment, the gas source 310 comprises a non-etching plasma pre-etch treatment gas sources 330 including a $H_2$ source 312 and a COS source 314, and an optional additional gas source 316. The gas source 310 may further comprise other gas sources, such as an etching gas source 318 for the subsequent etch processes for the etch layer to be performed in the processing chamber 300.

As shown in FIG. 5, an RF source 348 is electrically connected to the lower electrode 308. Chamber walls 352 surround the confinement rings 302, the upper electrode 304, and the lower electrode 308. The RF source 348 may comprise a 60 MHz power source. The RF source may also have a 2 MHz power source and a 27 MHz power source for the subsequent etch processes. Different combinations of connecting RF power to the electrode are possible. In the case of Lam Research Corporation's Dielectric Etch Systems such as Exelan® Flex™ Series, made by LAM Research Corporation™ of Fremont, Calif., which may be used in a preferred embodiment of the invention, the 27 MHz, 2 MHz, and 60 MHz power sources make up the RF power source 348 connected to the lower electrode, and the upper electrode is grounded. A controller 335 is controllably connected to the RF source 348, exhaust pump 320, and the gas source 310.

Figure 6A:
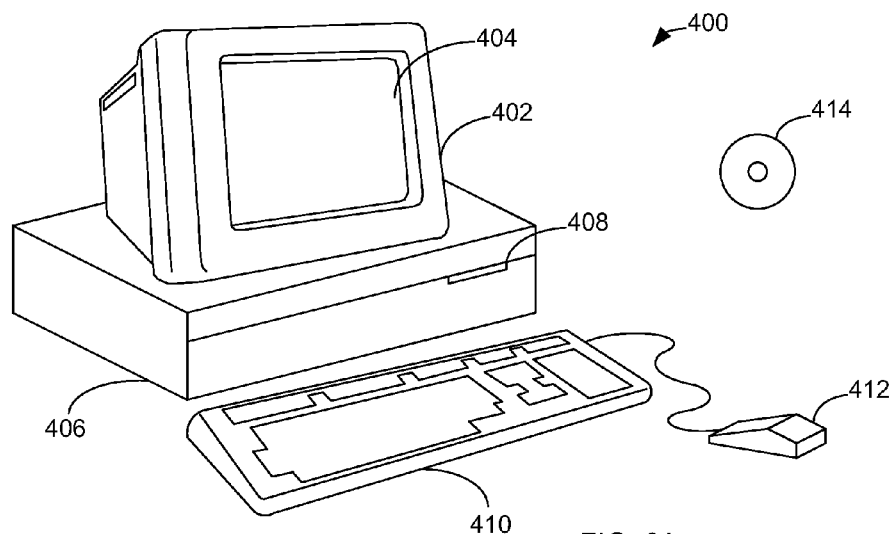
FIGS. 6A and 6B schematically illustrate a computer system, which is suitable for implementing a controller used in embodiments of the present invention.
Figure 6B:
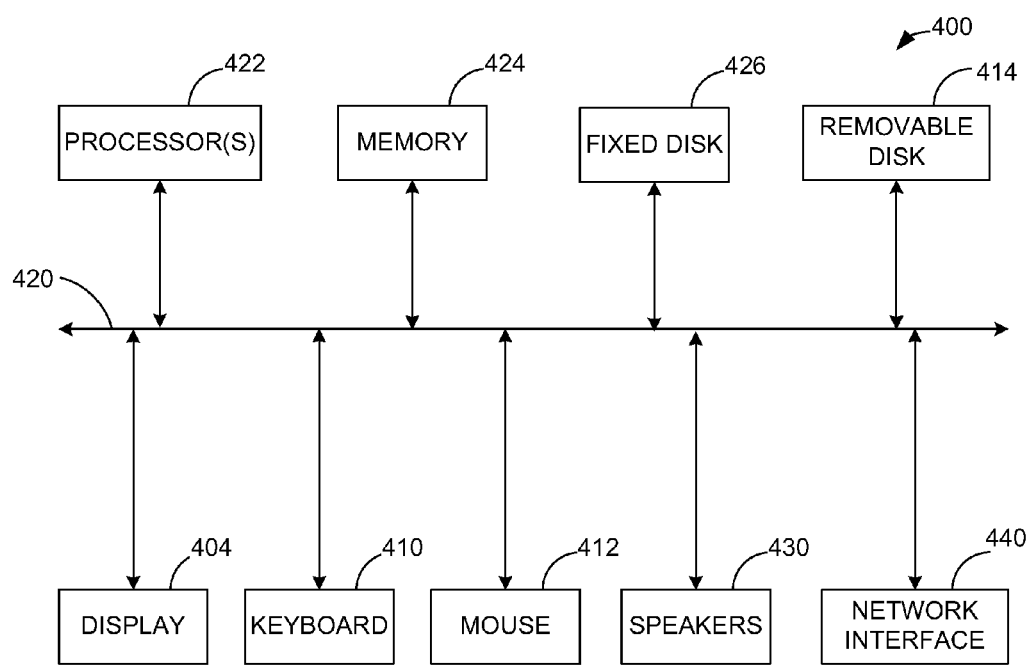

FIGS. 6A and 6B illustrate a computer system 400, which is suitable for implementing a controller 335 used in embodiments of the present invention. FIG. 6A shows one possible physical form of the computer system. Of course, the computer system may have many physical forms ranging from an integrated circuit, a printed circuit board, and a small hand-held device up to a huge super computer. Computer system 400 includes a monitor 402, a display 404, a housing 406, a disk drive 408, a keyboard 410, and a mouse 412. Disk 414 is a computer-readable medium used to transfer data to and from computer system 400.

FIG. 6B is an example of a block diagram for computer system 400. Attached to system bus 420 are a wide variety of subsystems. Processor(s) 422 (also referred to as central processing units, or CPUs) are coupled to storage devices, including memory 424. Memory 424 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 426 is also coupled bi-directionally to CPU 422; it provides additional data storage capacity and may also include any of the computer-readable media described below. Fixed disk 426 may be used to store programs, data, and the like and is typically a secondary storage medium (such as a hard disk) that is slower than primary storage. It will be appreciated that the information retained within fixed disk 426 may, in appropriate cases, be incorporated in standard fashion as virtual memory in memory 424. Removable disk 414 may take the form of the computer-readable media described below.

CPU 422 is also coupled to a variety of input/output devices, such as display 404, keyboard 410, mouse 412, and speakers 430. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 422 optionally may be coupled to another computer or telecommunications network using network interface 440. With such a network interface, it is contemplated that the CPU might receive information from the network, or might output information to the network in the course of performing the above-described method steps. Furthermore, method embodiments of the present invention may execute solely upon CPU 422 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of tangible computer-readable media include, but are not limited to: magnetic media such as hard disks, floppy disks, and magnetic tape; optical media such as CD-ROMs, DVDs, and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Examples: In the non-etching plasma pre-etch treatment (step 104 as described above), the treatment gas containing $H_2$ and COS is provided into the process chamber (confined plasma volume 340) from the non-etching plasma pre-etch treatment gas source 330. The treatment gas has a flow rate, and the $H_2$ and COS has at least 50% of the total flow of the treatment gas. Preferably, the $H_2$ and COS has at least 60% of the total flow of the treatment gas. More preferably, the $H_2$ and COS has at least 90% of the total flow of the treatment gas. In an embodiment of the present invention, the treatment gas essentially consists of $H_2$ and COS. Alternatively, the treatment gas may further contain $N_2$ and $C_4F_8$, for example, up to 10% of the total flow of the treatment gas. In accordance with an embodiment of the present invention, the flow ratio of $H_2$ and COS is between 10:1 to 60:1, preferably between 20:1 to 50:1, more preferably, about 30:1. The treatment is formed into a plasma using a low bias, for example, less than 500 volts. The bias voltage is controlled such that the non-etching plasma pre-etch treatment does not open or substantially etch an underlying layer exposed through the mask features. Practically, the bias voltage for the low bias may be between 100 to 150 volts. The flow of the treatment gas is stopped to end the non-etching plasma pre-etch treatment.

A specific example of a treatment recipe provides a non-etching plasma pre-etch treatment gas of 300 sccm $H_2$ and 10 sccm COS at a pressure of 15 mT. Ranges of the treatment gas in this example recipe may provide 100-600 sccm $H_2$ and 5 to 60 sccm COS, at pressures between 2-150 mT, with preferred pressure below 80 mT. Preferably, the ranges of the treatment gas in this example recipe may provide 200-500 sccm $H_2$ and 5 to 30 sccm COS, at pressures between 2-40 mT. The power provided to form a plasma from the treatment gas is 300-400 W at 60 MHz with a low bias voltage. More specifically, the power is 400 W. The bias voltage is between 0 to 500 volts, preferably between 0 to 150 volts, more preferably between 0 to 100 volts. That is, the non-etching plasma pre-etch treatment is more chemical reaction than physical. An electrostatic chuck temperature between −60° C. and 200° C. is provided, while more desirable temperature is between −30° C. and 120° C. The specific operating temperature for this treatment is generally dependent upon the temperature required to optimize the etch performance for subsequent layers of materials, and this temperature should not be limited to the range described above. The treatment process is maintained for 5-30 seconds, preferably about 12 seconds. Longer treatment time may be performed as needed to further improve LWR as long as there is enough PR thickness left for subsequent etch after prescribed non-etching plasma pre-etch treatment.

In accordance with embodiments of the present invention, the high-frequency LWR (inspection length less than 75 nm) after the non-etching plasma pre-etch treatment was about 3 nm or less, while the high and low-frequency LWR (inspection length about 400 nm) was about 4.5 nm or less. Compared with other additive gas, the novel combination of $H_2$ and COS is more effective for low frequency LWR improvement, reducing wiggling of the line pattern.

While this invention has been described in terms of several preferred embodiments, there are alterations, permutations, modifications, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method for reducing line width roughness (LWR) of a feature in an etch layer below a patterned photoresist mask formed of a photoresist material and having mask features, the method comprising:
    non-etching plasma pre-etch treatment of the photoresist mask, comprising:
        providing a treatment gas containing $H_2$ and COS;
        forming a plasma from the treatment gas;
    stopping the treatment gas; and
    etching a feature in the etch layer through the pre-treated photoresist mask using an etching gas:

wherein the non-etching plasma pre-etch treatment does not open or substantially etch the etch layer below the patterned photoresist mask through the patterned photoresist mask, and wherein the etching the feature in the etch layer through the pre-treated photoresist mask reduces the LWR compared with etching of a feature in the etch layer through the patterned photoresist mask without performing the non-etching plasma pre-etch treatment of the photoresist mask.

2. The method as recited in claim 1, wherein said non-etching plasma pre-etch treatment further comprises:

curing and smoothing surfaces of the mask features using the plasma formed from the treatment gas.

3. The method as recited in claim 2, wherein said curing and smoothing includes:

reducing single and double C—O bonds from the surfaces of the photoresist mask using $H_2$ component; and depositing materials on sidewalls of the mask features using COS component.

4. The method as recited in claim 3, wherein a thickness of the deposited materials is less than 5 nm.

5. The method as recited in claim 1, wherein $H_2$ and COS has at least 50% of a total flow of the treatment gas.

6. The method as recited claim 4, wherein the treatment gas further contains $N_2$ and $C_4F_8$.

7. The method as recited claim 1, wherein the treatment gas essentially consists of $H_2$ and COS.

8. The method as recited claim 1, wherein a flow ratio of $H_2$ and COS is about 10:1 to 60:1.

9. The method as recited claim 1, wherein a flow ratio of $H_2$ and COS is about 20:1 to 50:1.

10. The method as recited claim 1, wherein said non-etching pre-etch treatment includes:

controlling a bias voltage such that the non-etching plasma pre-etch treatment does not open or substantially etch an underlying layer exposed through the mask features.

11. The method as recited claim 1, wherein said forming the plasma includes:

applying a bias voltage between 0 to 500 V.

12. The method as recited claim 1, wherein said forming the plasma includes:

applying a bias voltage between 0 to 150 V.

13. The method as recited in claim 1, wherein said non-etching pre-treating substantially preserves an original aspect ratio of the mask features.

14. A method for reducing line width roughness (LWR) of a feature in an etch layer below a patterned photoresist mask formed of a photoresist material and having mask features, the method comprising:

non-etching plasma pre-etch treatment of the photoresist mask, comprising:

providing a treatment gas containing $H_2$ and COS;

forming a plasma from the treatment gas;

stopping the treatment gas; and etching a feature in the etch layer through the pre-treated photoresist mask using an etching gas, wherein the non-etching plasma pre-etch treatment does not open or substantially etch the etch layer below the patterned photoresist mask through the patterned photoresist mask, and further comprises:

curing and smoothing surfaces of the mask features using the plasma formed from the treatment gas.

15. The method as recited in claim 14, wherein said curing and smoothing includes:

reducing single and double C—O bonds from the surfaces of the photoresist mask using $H_2$ component; and depositing materials on sidewalls of the mask features using COS component.

16. The method as recited in claim 15, wherein a thickness of the deposited materials is less than 5 nm.

17. The method as recited claim 16, wherein the treatment gas further contains $N_2$ and $C_4F_8$.

18. The method as recited in claim 14, wherein $H_2$ and COS has at least 50% of a total flow of the treatment gas.

19. The method as recited claim 14, wherein the treatment gas essentially consists of $H_2$ and COS.

20. The method as recited claim 14, wherein said non-etching pre-treating substantially preserves an original aspect ratio of the mask features.

* * * * *